(12) United States Patent
Yang et al.

(10) Patent No.: US 11,489,315 B2
(45) Date of Patent: Nov. 1, 2022

(54) ON-CHIP INTEGRATED SEMICONDUCTOR LASER STRUCTURE AND METHOD FOR PREPARING THE SAME

(71) Applicant: INSTITUTE OF SEMICONDUCTORS, CHINESE ACADEMY OF SCIENCES, Beijing (CN)

(72) Inventors: Chengao Yang, Beijing (CN); Zhichuan Niu, Beijing (CN); Yu Zhang, Beijing (CN); Yingqiang Xu, Beijing (CN); Shengwen Xie, Beijing (CN); Yi Zhang, Beijing (CN); Jinming Shang, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 208 days.

(21) Appl. No.: 17/253,747

(22) PCT Filed: Oct. 31, 2019

(86) PCT No.: PCT/CN2019/114740
§ 371 (c)(1),
(2) Date: Dec. 18, 2020

(87) PCT Pub. No.: WO2020/151290
PCT Pub. Date: Jul. 30, 2020

(65) Prior Publication Data
US 2021/0296849 A1    Sep. 23, 2021

(30) Foreign Application Priority Data
Jan. 22, 2019  (CN) .......................... 201910061317.9

(51) Int. Cl.
*H01S 5/00*  (2006.01)
*H01S 5/40*  (2006.01)
(Continued)

(52) U.S. Cl.
CPC .......... *H01S 5/4043* (2013.01); *H01S 5/0203* (2013.01); *H01S 5/026* (2013.01);
(Continued)

(58) Field of Classification Search
CPC ...... H01S 5/4043; H01S 5/0203; H01S 5/026; H01S 5/04257; H01S 5/1237; H01S 5/16;
(Continued)

(56) References Cited

U.S. PATENT DOCUMENTS 5,585,957 A * 12/1996 Nakao ..................... H01S 5/227
257/14
6,282,220 B1 * 8/2001 Floyd ..................... B82Y 20/00
438/455
(Continued)

*Primary Examiner* — Kinam Park
(74) *Attorney, Agent, or Firm* — Christopher R. Christenson; Kelly, Holt & Christenson, PLLC

(57) ABSTRACT

An on-chip integrated semiconductor laser structure and a method for preparing the same. The structure includes: an epitaxial structure including a first N contact layer, a first N confinement layer, a first active region, a first P confinement layer, a first P contact layer, an isolation layer, a second N contact layer, a second N confinement layer, a second active region, a second P confinement layer, and a second P contact layer sequentially deposited on a substrate; a first waveguide and a second waveguide; a first optical grating and a second optical grating; and current injection windows.

13 Claims, 4 Drawing Sheets

(51) Int. Cl.
*H01S 5/02* (2006.01)
*H01S 5/026* (2006.01)
*H01S 5/12* (2021.01)
*H01S 5/042* (2006.01)
*H01S 5/16* (2006.01)
*H01S 5/343* (2006.01)

(52) U.S. Cl.
CPC ........ *H01S 5/04257* (2019.08); *H01S 5/1237* (2013.01); *H01S 5/16* (2013.01); *H01S 5/34346* (2013.01)

(58) Field of Classification Search
CPC ...... H01S 5/34346; H01S 5/1231; H01S 5/22; H01S 5/34306; H01S 5/4087; H01S 5/0205; H01S 5/20; H01S 5/32
See application file for complete search history.

(56) References Cited

U.S. PATENT DOCUMENTS

| | | | |
|---|---|---|---|
| 2003/0034538 A1* | 2/2003 | Brophy | H01S 5/4031 |
| | | | 257/E21.12 |
| 2006/0062267 A1* | 3/2006 | Tanaka | B82Y 20/00 |
| 2006/0239321 A1* | 10/2006 | Kume | G11B 7/1275 |
| | | | 372/50.122 |
| 2012/0287958 A1* | 11/2012 | Lell | H01S 5/4043 |
| | | | 372/45.01 |
| 2013/0016752 A1* | 1/2013 | Lell | H01S 5/4087 |
| | | | 438/22 |

\* cited by examiner

ON-CHIP INTEGRATED SEMICONDUCTOR LASER STRUCTURE AND METHOD FOR PREPARING THE SAME

CROSS-REFERENCE TO RELATED APPLICATION

This application corresponds to the PCT international application PCT/CN2019/114740 filed on Oct. 31, 2019, and claims priority to the Chinese Patent Application No. 201910061317.9, filed on Jan. 22, 2019, which is incorporated herein by reference in its entirety.

TECHNICAL FIELD

The present disclosure relates to the field of a monolithic integrated semiconductor laser, in particular to an on-chip integrated semiconductor laser structure, and a method for preparing the on-chip integrated semiconductor laser structure.

BACKGROUND

Semiconductor lasers have advantages of high output power, small size, light weight, and high photoelectric conversion efficiency, etc. In particular, semiconductor edge-emitting lasers have great advantages in terms of high efficiency, high power, and gas detection.

A common semiconductor laser is a PN junction structure or a PIN junction structure. The lasing wavelength is directly affected by a material and a structure of an active region. For a special application requirement of gas monitoring, due to different characteristic absorption peaks of the gas itself, single-mode lasers with different wavelengths need to be configured for different gas detection to achieve gas detection, which is not only expensive, but also the configuration of multiple separately packaged semiconductor lasers may greatly increase the volume and weight of the entire system.

SUMMARY

Embodiments of the present disclosure provide an on-chip integrated semiconductor laser structure and a method for preparing the same, wherein the laser structure comprises: a first N contact layer, a first N confinement layer, a first active region, a first P confinement layer, a first P contact layer, an isolation layer, a second N contact layer, a second N confinement layer, a second active region, a second P confinement layer and a second P contact layer sequentially deposited on a substrate as an epitaxial structure; waveguide structures, a waveguide structure of a first laser being etched from the second P contact layer to an interface of the second active region, and a waveguide structure of a second laser being etched from the first P contact layer to an interface of the first active region; optical gratings respectively on both sides of the waveguide structure of the first laser and on both sides of the waveguide structure of the second laser to realize selection of laser modes; and current injection windows, a first N-side current injection window of the first laser being prepared on the second N contact layer, a second N-side current injection window of the first laser being prepared on the first N contact layer, and a P-side current injection window of the first laser being prepared on the waveguide structure of the first laser, and a P-side current injection window of the second laser being prepared on the waveguide of the second laser.

Further, the laser structure has current isolation zones comprising a first current isolation zone and a second current isolation zone, wherein the first current isolation zone is between the P-side current injection window of the first laser and the P-side current injection window of the second laser to form an electrical isolation; and the second current isolation zone is between the P-side current injection window of the first laser and the first N-side current injection window of the first laser to form an electrical isolation.

Further, the laser structure has current injection slots comprising a first current injection slot, a second current injection slot, and a third current injection slot, wherein the first current injection slot is etched to the first P contact layer; the second current injection slot is etched to the second N contact layer; the third current injection slot is etched to the first N contact layer; and the third current injection slot is in the second current injection slot, and the waveguide structure of the second laser is in the first current injection slot.

Further, the laser structure comprises: the substrate which is an N-type GaSb substrate; the first N contact layer, N-type doping, with a material composition of GaSb, a doping concentration of $1\times10^{17}$-$1\times10^{19}$ cm$^{-3}$, and a thickness of 200 nm-700 nm; the first N confinement layer, with a material of AlGaAaSb, an Al composition of 0.4-0.9, a doping concentration of $1\times10^{18}$-$8\times10^{18}$ cm$^{-3}$, and a thickness of 600 nm-3000 nm; the first active region, unintentional doping, with a material of AlGaAsSb\InGaAsSb\AlGaAsSb, an Al composition of 0.1-0.3, an In composition of 0.25-0.4, and a thickness of 100 nm-700 nm; the first P confinement layer, P-type doping, with a material of AlGaAaSb, an Al composition of 0.4-0.9, a doping concentration of $1\times10^{18}$-$8\times10^{18}$ cm$^{-3}$, and a thickness of 600 nm-3000 nm; the first P contact layer, P-type doping, with a material of GaSb, a doping concentration of $1\times10^{17}$-$1\times10^{19}$ cm$^{-3}$, and a thickness of 50 nm-300 nm; the isolation layer, unintentional doping, with a material of $Al_{0.1}Ga_{0.9}Sb\backslash Al_{0.6}Ga_{0.4}AsSb\backslash Al_{0.1}Ga_{0.9}AsSb$, an Al composition linearly changing from $Al_{0.1}Ga_{0.9}Sb$ to $Al_{0.6}Ga_{0.4}AsSb$ and then linearly changing to $Al_{0.1}Ga_{0.9}AsSb$, and a thickness of a gradation zone being 300 nm-900 nm; the second N contact layer, N-type doping, with a material of GaSb, a doping concentration of $1\times10^{17}$-$1\times10^{19}$ cm$^{-3}$, and a thickness of 300 nm-900 nm; the second N confinement layer, with a material of AlGaAsSb, an Al composition of 0.5-0.85, a doping concentration of $1\times10^{18}$-$8\times10^{18}$ cm$^{-3}$, and a thickness of 600 nm-3000 nm; the second active region, unintentional doping, with a material of AlGaAsSb\InGaAsSb\AlGaAsSb, an Al composition of 0.15-0.35, an In composition of 0.1-0.3, and a thickness of 100 nm-600 nm; the second P confinement layer, P-type doping, with a material of AlGaAsSb, an Al composition of 0.5-0.85, a doping concentration of $1\times10^{18}$-$8\times10^{18}$ cm$^{-3}$, and a thickness of 600 nm-3000 nm; and the second P contact layer, P-type heavily doping, with a material of GaSb, a doping concentration of $1\times10^{17}$-$1\times10^{19}$ cm$^{-3}$, and a thickness of 50 nm-500 nm.

Further, the waveguide structure of the first laser and the waveguide structure of the second laser are strip waveguides with a width of 1 μm-6 μm, which are etched to prepare waveguide structures of the same height or are separately etched to prepare waveguide structures of different heights.

Further, the optical grating is a periodic optical grating uniformly distributed on both sides of the waveguide and perpendicular to an extending direction of the waveguide, and an optical grating period satisfies $\lambda = \Lambda \times Neff/m$, where $\lambda$ is a laser lasing wavelength, Neff is an effective refractive index of the waveguide structure, Λ is an optical grating period, and m is an optical grating order.

Further, the first N-side current injection window of the first laser and the second N-side current injection window of the first laser enable an electrical conduction between the second N contact layer and the substrate.

Further, widths of the first current isolation zone and the second current isolation zone are 30 μm-300 μm.

The present disclosure further provides a method for preparing an on-chip integrated semiconductor laser, comprising:

preparing a N-type substrate;

depositing a first N contact layer, a first N confinement layer, a first active region, a first P confinement layer, a first P contact layer, an isolation layer, a second N contact layer, a second N confinement layer, a second active region, a second P confinement layer, and a second P contact layer sequentially on the N-type substrate;

etching waveguide structures and current injection slots on the epitaxial structures comprising:

forming a waveguide structure of a first laser by photolithography and etching;

forming a first current injection slot of a second laser by photolithography and etching;

forming a waveguide structure of the second laser in the first current injection slot by photolithography and etching;

forming a second current injection slot by photolithography and etching;

forming a third current injection slot in the second current injection slot by photolithography and etching;

preparing optical grating mask patterns on both sides of the waveguide structures;

depositing an insulating dielectric layer in the current injection slots, and photoetching the insulating dielectric layer to form a current injection window;

forming electrode patterns by photolithography and etching, depositing P-side metal electrodes, and preparing a first current isolation zone and a second current isolation zone by stripping or etching;

thinning and polishing the substrate, and forming a back electrode on the back of the substrate; and performing an anneal and a cleavage to form rectangular chips to complete the preparation.

BRIEF DESCRIPTION OF THE ACCOMPANYING DRAWINGS

In order to make objectives, technical solutions, and advantages of the present disclosure clearer, the embodiments of the present disclosure may be described in detail in conjunction with embodiments and with reference to the accompanying drawings, in which.

In addition, the drawings are not necessarily drawn to scale, but are only shown in a schematic way that does not affect readers' understanding.

DETAILED DESCRIPTION

In order to make objectives, technical solutions, and advantages of the present disclosure clearer, the present disclosure will be further described in detail below in conjunction with embodiments and with reference to the accompanying drawings.

Figure 1:
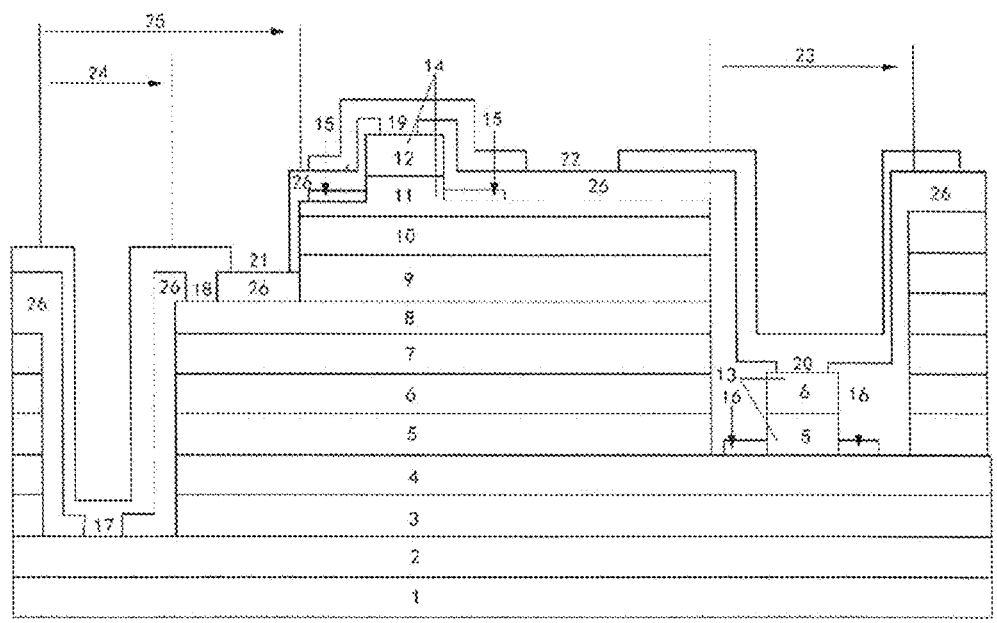
FIG. 1 is a schematic cross-sectional view of a laser structure according to an embodiment of the present disclosure.

An embodiment of the present disclosure provides an on-chip integrated semiconductor laser structure, please refer to FIG. 1, the on-chip integrated semiconductor laser structure includes: a first N contact layer 2, a first N confinement layer 3, a first active region 4, a first P confinement layer 5, a first P contact layer 6, an isolation layer 7, a second N contact layer 8, a second N confinement layer 9, a second active region 10, a second P confinement layer 11, and a second P contact layer 12 sequentially deposited on a substrate 1 as an epitaxial structure, and the epitaxial structure is etched by photolithography to realize a fabrication of a dual-wavelength laser. The integrated dual-wavelength semiconductor laser structure provided by embodiments of the present disclosure utilizes special energy band engineering and epitaxial structure design to realize growth of epitaxial materials of semiconductor lasers of different wavelengths on the same epitaxial wafer, and to realize an on-chip integration of the dual-wavelength laser and a compact structure. These two lasers are used in independent waveguide structures and optical grating structures, and may be operated separately to produce single-mode laser and lase lasers at two different wavelengths on the same laser, to detect different types of gases.

In some embodiments, the substrate 1 is an N-type GaSb substrate, and the epitaxial structure includes: the first N contact layer 2, N-type doping, with the material composition of GaSb, the doping concentration of $1 \times 10^{17}$-$1 \times 10^{19}$ cm$^{-3}$, and the thickness of 200 nm-700 nm; the first N confinement layer 3, with the material of AlGaAaSb, the Al composition of 0.4-0.9, the doping concentration of $1 \times 10^{18}$-$3 \times 10^{18}$ cm$^{-3}$, and the thickness of 600 nm-3000 nm; the first active region 4, unintentional doping, with the material of AlGaAsSb\InGaAsSb\AlGaAsSb, the Al composition of 0.1-0.3, the In composition of 0.25-0.4, and the thickness of 100 nm-700 nm; the first P confinement layer 5, P-type doping, with the material of AlGaAaSb, the Al composition of 0.4-0.9, the doping concentration of $1 \times 10^{18}$-$8 \times 10^{18}$ cm$^{-3}$, and the thickness of 600 nm-3000 nm; the first P contact layer 6, P-type doping, with the material of GaSb, the doping concentration of $1 \times 10^{17}$-$1 \times 10^{19}$ cm$^{-3}$, and the thickness of 50 nm-300 nm; the isolation layer 7, unintentional doping, with the material of $Al_{0.1}Ga_{0.9}Sb\backslash Al_{0.6}Ga_{0.4}AsSb\backslash Al_{0.1}Ga_{0.9}AsSb$, the Al composition linearly changing from $Al_{0.1}Ga_{0.9}Sb$ to $Al_{0.6}Ga_{0.4}AsSb$ and then linearly changing to $Al_{0.1}Ga_{0.9}AsSb$, the thickness of a gradation zone being 300 nm-900 nm; the second N contact layer 8, N-type heavily doping, with the material of GaSb, the doping concentration of $1 \times 10^{17}$-$1 \times 10^{19}$ cm$^{-3}$, and the thickness of 300 nm-900 nm; the second N confinement layer 9, with the material of AlGaAsSb, the Al composition of 0.5-0.85, the doping concentration of $1 \times 10^{18}$-$8 \times 10^{18}$ cm$^{-3}$, and the thickness of 600 nm-3000 nm; the second active region 10, unintentional doping, with the material of AlGaAsSb\InGaAsSb\AlGaAsSb, the Al composition of 0.15-0.35, the In composition of 0.1-0.3, and the thickness of 100 nm-600 nm; the second P confinement layer 11, P-type doping, with the material of AlGaAsSb, the Al composition of 0.5-0.85, the doping concentration of $1\times10^{18}$-$8\times10^{18}$ cm$^{-3}$, and the thickness of 600 nm-3000 nm; and the second P contact layer 12, P-type heavily doping, with the material of GaSb, the doping concentration of $1\times10^{17}$-$1\times10^{19}$ cm$^{-3}$, and the thickness of 50 nm-500 nm.

A first waveguide structure 14 (also referred to as a waveguide structure 14 of the first laser) is etched from the second P contact layer 12 to the interface of the second active region 10, and a second waveguide structure 13 (also referred to as a waveguide structure 13 of the second laser) is etched from the first P contact layer 6 to the interface of the first active region 4.

In some embodiments, the waveguide structures of the first laser and the second laser are strip waveguides with widths of 1 μm-6 μm. The waveguide structures of the first laser and the second laser are etched and prepared into waveguide structures of the same height or prepared separately into waveguide structures of different heights.

A first optical grating 15 (also referred to as an optical grating 15 of the first laser) is on both sides of the waveguide structure 14 of the first laser, and a second optical grating 16 (also referred to as an optical grating 16 of the second laser) is on both sides of the waveguide structure 13 of the second laser, so as to realize the selection of laser modes.

In some embodiments, the optical grating is a periodic optical grating uniformly distributed on both sides of the waveguide and perpendicular to an extending direction of the waveguide. An optical grating period satisfies $\lambda = \Lambda \times \text{Neff}/m$, where $\lambda$ is a wavelength lased by a laser, Neff is an effective refractive index of the waveguide structure, $\Lambda$ is an optical grating period, and m is an optical grating order.

A first N-side current injection window 18 of the first laser is prepared on the second N contact layer 8, and a second N-side current injection window 17 of the first laser is prepared on the first N contact layer 2. A first P-side current injection window 19 (also referred to as a P-side current injection window 19 of the first laser) is prepared on the waveguide structure 14 of the first laser, and a second P-side current injection window 20 (also referred to as a P-side current injection window 20 of the second laser) is prepared on the waveguide structure 13 of the second laser.

In some embodiments, the first N-side current injection window 18 of the first laser and the second N-side current injection window 17 of the first laser enable an electrical conduction between the second N contact layer 8 doped by the first laser and the substrate 1.

In some embodiments, the laser structure has current isolation zones including a first current isolation zone 22 and a second current isolation zone 21. Where the first current isolation zone 22 is between the P-side current injection window 19 of the first laser and the P-side current injection window 20 of the second laser to form an electrical isolation; and the second current isolation zone 21 is between the P-side current injection window 19 of the first laser and the first N-side current injection window 18 of the first laser to form an electrical isolation.

In some embodiments, the widths of the first current isolation zone 22 and the second current isolation zone 21 are 30 μm-300 μm.

In some embodiments, the laser structure has current injection slots including a first current injection slot 23, a second current injection slot 25, and a third current injection slot 24. Where the first current injection slot 23 is etched to the first P contact layer 6; the second current injection slot 25 is etched to the second N contact layer 8; and the third current injection slot 24 is etched to the first N contact layer 2.

Furthermore, the third current injection slot 24 is in the second current injection slot 25, and the waveguide structure 13 of the second laser is in the first current injection slot 23. An integrated preparation of driving electrodes of the two lasers is realized through a special design of the current injection slot and the isolation slot. At the same time, the two lasers are electrically injected and electrically isolated, respectively. The two lasers may be driven separately, and the process maturity is high. Both the lasers are prepared with independent optical gratings, and the selection of modes is completed for lasers at different wavelengths to realize separate operations of single-mode lasers of two wavelengths.

Figure 2:
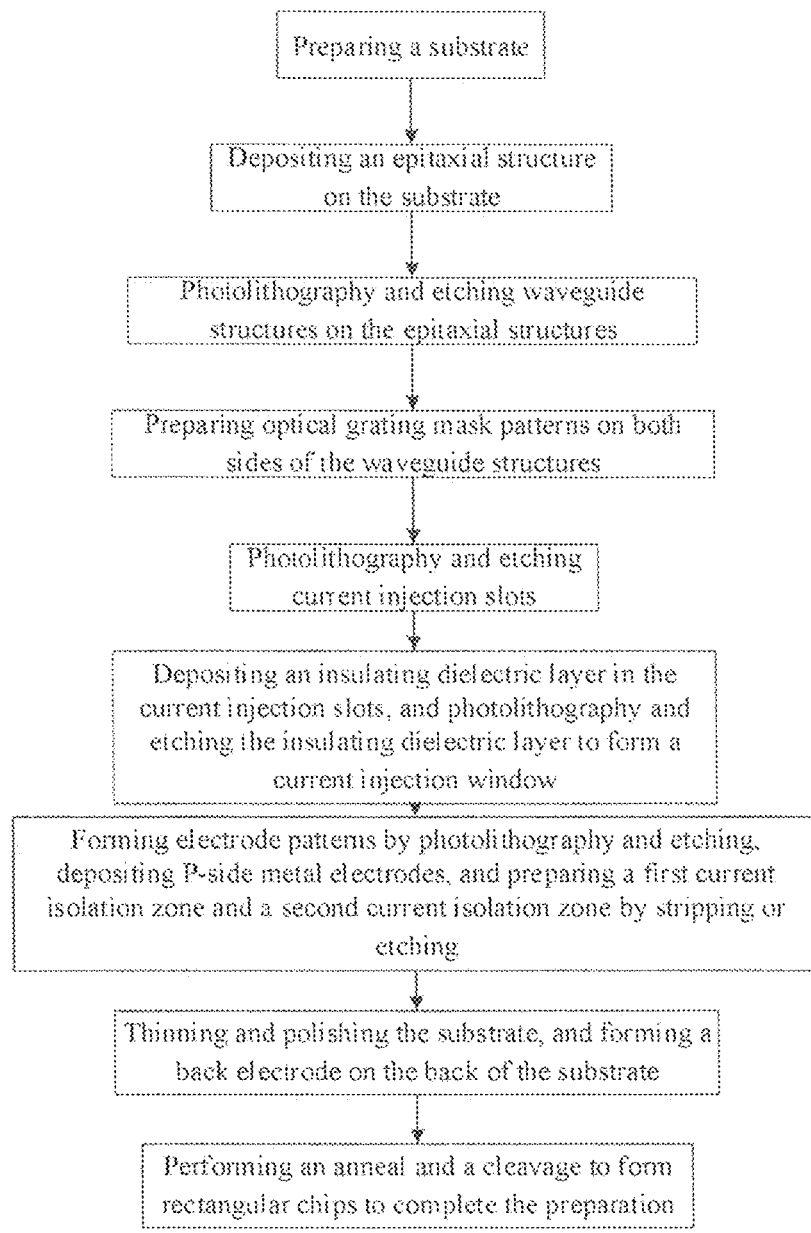
FIG. 2 is a flowchart of a method for preparing the laser structure according to an embodiment of the present disclosure.

Another embodiment of the present disclosure provides a method for preparing the on-chip integrated semiconductor laser structure. Each part of the method for preparing the on-chip integrated dual-wavelength semiconductor laser structure in this embodiment may be described in detail with reference to FIG. 2.

Step 1: An N-type GaSb substrate 1 is prepared.

Step 2: A first N contact layer 2, a first N confinement layer 3, a first active region 4, a first P confinement layer 5, a first P contact layer 6, an isolation layer 7, a second N contact layer 8, a second N confinement layer 9, a second active region 10, a second P confinement layer 11, and a second P contact layer 12 are sequentially deposited on the N-type substrate.

In this embodiment, the above layers are sequentially deposited on the N-type substrate 1, where a material of the first N contact layer 2 is GaSb, a thickness of the first N contact layer 2 is 500 nm, and a doping concentration of the first N contact layer 2 is $2\times10^{18}$ cm$^{-3}$; a material of the first N confinement layer 3 is $Al_{0.6}Ga_{0.4}As_{0.02}Sb_{0.98}$, a thickness of the first N confinement layer 3 is 2 μm, and a doping concentration of the first N confinement layer 3 is $4\times10^{17}$ cm$^{-3}$; a material of the first active region 4 is $Al_{0.28}Ga_{0.81}As_{0.02}Sb_{0.98}\backslash In_{0.3}Ga_{0.85}Sb\backslash Al_{0.28}Ga_{0.81}As_{0.02}Sb_{0.98}$ and a thickness thereof is 120 nm/10 nm/120 nm, respectively; a material of the first P confinement layer 5 is $Al_{0.6}Ga_{0.4}As_{0.02}Sb_{0.98}$, a thickness of the first P confinement layer 5 is 2 μm, and a doping concentration of the first P confinement layer 5 is $5\times10^{18}$ cm$^{-3}$; a material of the first P contact layer 6 is GaSb, a thickness of the first P contact layer 6 is 200 nm, and a doping concentration of the first P contact layer 6 is $9\times10^{18}$ cm$^{-3}$; a material of a gradient isolation layer 7 is $Al_{0.1}Ga_{0.9}As_{0.02}Sb_{0.98}\backslash Al_{0.6}Ga_{0.4}As_{0.02}Sb_{0.98}\backslash Al_{0.1}Ga_{0.9}As_{0.02}Sb_{0.98}$, a thickness of the gradient isolation layer 7 is 500 nm; the material of the second N contact layer 8 is GaSb, a thickness of the second N contact layer 8 is 400 nm, and a doping concentration of the second N contact layer 8 is $8\times10^{18}$ cm$^{-3}$; the material of the second N confinement layer 9 is $Al_{0.55}Ga_{0.4}As_{0.02}Sb_{0.98}$, a thickness of the second N confinement layer 9 is 1.8 μm, and a doping concentration of the second N confinement layer 9 is $5\times10^{18}$ cm$^{-3}$; the material of the second active region 10 is $Al_{0.28}Ga_{0.81}As_{0.02}Sb_{0.98}\backslash In_{0.18}Ga_{0.85}Sb\backslash Al_{0.28}Ga_{0.81}As_{0.02}Sb_{0.98}$, respectively, and a thickness thereof is 300 nm/8 nm/300 nm, respectively; the material of the second P confinement layer 11 is $Al_{0.55}Ga_{0.4}As_{0.02}Sb_{0.98}$, a thickness of the second P confinement layer 11 is 1.8 μm; and the material of the second P contact Layer 12 is GaSb, a thickness of the second P contact layer 12 is 270 nm, and a beryllium doping concentration is $1\times10^{19}$ cm$^{-3}$.

Step 3: A waveguide structure and a current injection slot are etched on the epitaxial structure by photolithography.

In some embodiments, this step includes: forming a waveguide structure of the first laser by photolithography and etching; forming a first current injection slot of the second laser by photolithography and etching; forming a waveguide structure of the second laser in the first current injection slot by photolithography and etching; forming a second current injection slot by photolithography and etching; and forming a third current injection slot in the second current injection slot.

In this embodiment, first, a strip waveguide 14 of the first laser is formed by photolithography and etching, a width of strip waveguide 14 is 3 μm, and an etching depth of strip waveguide 14 is 1.92 μm, and then the first current injection slot 23 of the second laser is formed by photolithography and etching, a depth of the first current injection slot 23 is 5.378 μm, and a width of the first current injection slot 23 is 100 nm, and a waveguide 13 of the second laser is formed in the first current injection slot 23 by photolithography and etching, a width of the waveguide 13 is 4.5 μm, and a depth of the waveguide 13 is 2.05 μm; and the second current injection slot 25 is formed by photolithography and etching, a width of the second current injection slot 25 is 250 μm, and a depth of the second current injection slot 25 is 4.478 μm, and the third current injection slot 24 is formed in the second current injection slot 25 by photolithography and etching, a width of the third current injection slot 24 is 100 μm, and a depth of the third current injection slot 24 is 5.35 μm.

Step 4: Optical grating mask patterns are prepared on both sides of the waveguide structure.

In this embodiment, optical grating mask patterns are prepared on both sides of the strip waveguide 14 of the first laser, an optical grating period of which is 555 nm, and a duty cycle of which is 0.3, and the first optical grating 15 with a uniform period is formed by etching down by 200 nm. Optical grating mask patterns are prepared on both sides of the waveguide 13 of the second laser, an optical grating period of which is 688 nm, and a duty cycle of which is 0.4, and the second optical grating 16 with a uniform period is formed by etching down by 200 nm.

Step 5: An insulating dielectric layer is deposited in the current injection slot and the insulating dielectric layer is etched by photolithography to form a current injection window.

In this embodiment, the insulating dielectric layer 26 is deposited, the material of the insulating dielectric layer 26 is $Si_3N_4$, and the thickness of the insulating dielectric layer 26 is 300 nm.

A 2 μm current injection window mask is formed by photolithography on the strip waveguide 14 of the first laser, the strip waveguide 13 of the second laser, the second current injection slot 25, and the third current injection slot 24 and $Si_3N_4$ is etched by dry etching by 300 nm to form a P-side current injection window 19 of the first laser, a first N-side current injection window 18 of the first laser, a second N-side current injection window 17 of the first laser, and a P-side current injection window 20 of the second laser.

Step 6: An electrode pattern is formed by photolithography and a P-side metal electrode is deposited. A first current isolation zone and a second current isolation zone are prepared by stripping or etching.

In this embodiment, an electrode pattern is formed by photolithography and the P-side metal electrode with TiPtAu 50\50\300 nm is magnetron sputtered in an isolation slot. The first current isolation zone 22 with a width of 50 μm and the second current isolation zone 21 with a width of 50 μm are prepared by stripping with glue.

Step 7: The substrate is thinned and polished, and a back electrode is fabricated on a back of the substrate.

In this embodiment, the substrate is thinned to 100 μm and polished, and a back electrode Ni\AuGe\Au=5\50\300 nm is formed on the back of the substrate.

Step 8: An anneal is performed, and rectangular chips are formed by cleavage, so that the preparation is completed.

In this embodiment, anneal is performed, and a rectangular chip of 1000 μm×1.5 mm is formed by cleavage to complete the preparation.

In addition, above definitions of various elements and methods are not limited to various specific structures or shapes mentioned in the embodiments, and those of ordinary skill in the art may make simple and well-known replacements, for example: (1) dry etching may be replaced by wet etching; (2) an SiNx insulating layer may be replaced by $SiO_2$ insulating layer.

Figure 3:
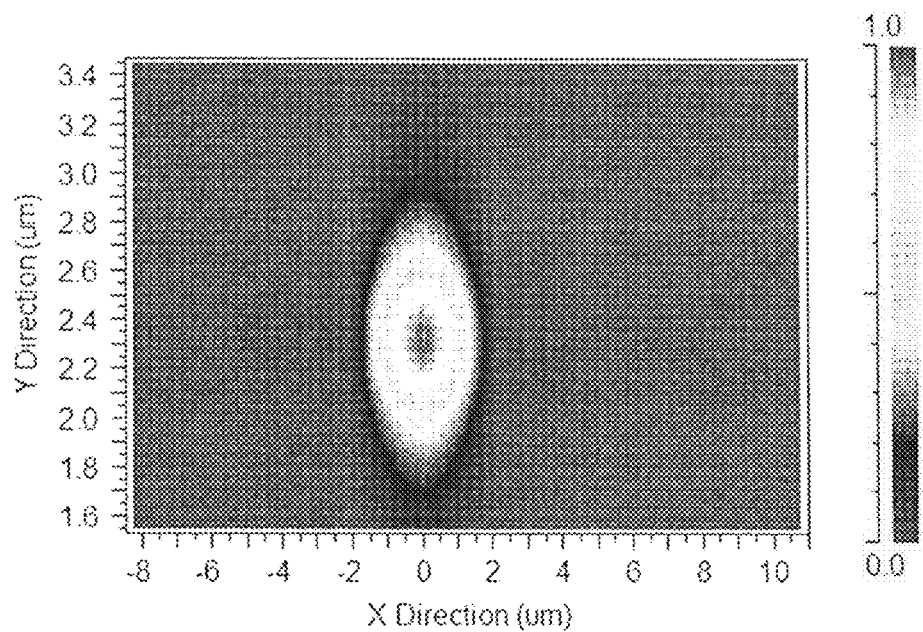
FIG. 3 is a simulation diagram of a light field mode distribution of the laser according to an embodiment of the present disclosure.
Figure 4:
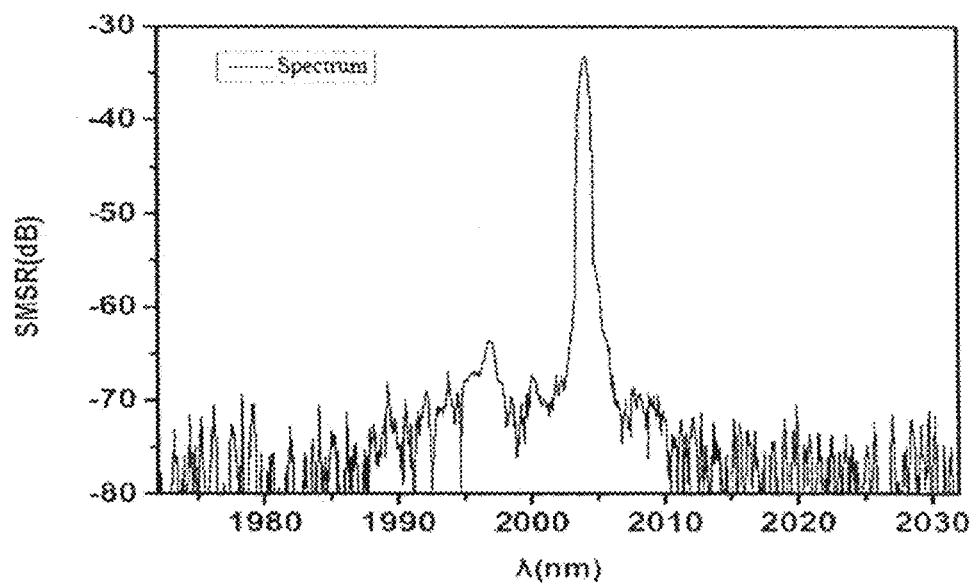
FIG. 4 is a single-mode lasing spectrum diagram of first laser operating separately according to an embodiment of the present disclosure.
Figure 5:
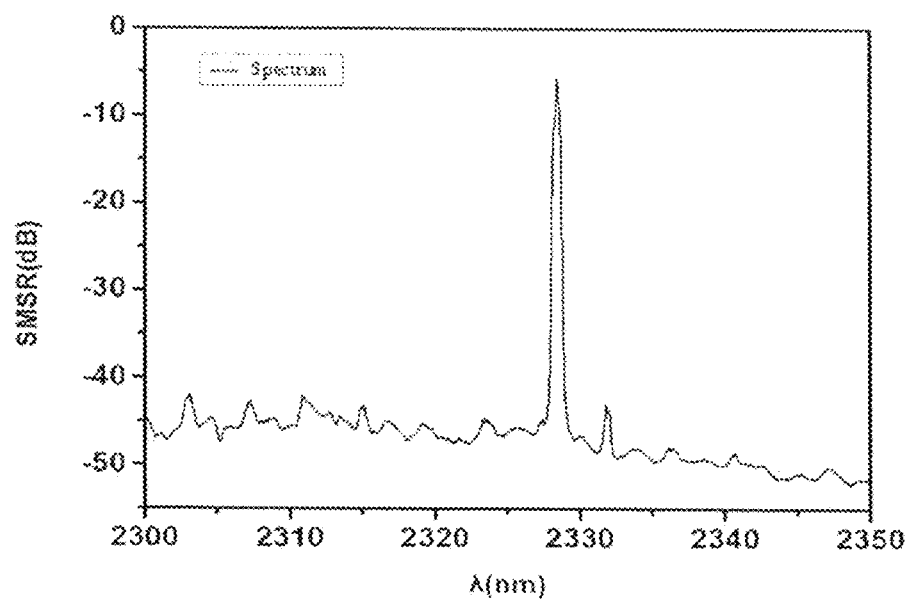
FIG. 5 is a single-mode lasing spectrum diagram of second laser operating separately according to an embodiment of the present disclosure.

FIG. 3 is a simulation diagram of a light field mode distribution of the laser according to an embodiment of the present disclosure; FIG. 4 is a single-mode lasing spectrum diagram of first laser operating separately according to an embodiment of the present disclosure; FIG. 5 is a single-mode lasing spectrum diagram of second laser operating separately according to an embodiment of the present disclosure. As can be seen from FIGS. 4 and 5 that two different single-mode lasers may be lased by controlling the two lasers to operate separately.

In summary, the present disclosure provides an on-chip integrated dual-wavelength semiconductor laser structure and a method for preparing the same. In the embodiments of the present disclosure, an NIPINP-type structure is prepared on the epitaxial wafer of the same laser, and an intermediate I layer adopts a non-doped gradient insulating layer material to realize good electrical isolation of the epitaxial material. An on-chip dual-wavelength laser is realized by changing material compositions of an active region on the same epitaxial wafer, taking advantage of a wide coverage of lasing wavelengths of the semiconductor material. The two lasers have their own independent waveguide structures and optical gratings each, which are used to select modes of target wavelengths. At the same time, different current injection slots and isolation slots are designed to realize separate control and injection of current of two PIN junctions. That is, a dual-wavelength laser lasing is realized on the same epitaxial wafer. Each laser has an independent epitaxial layer structure and a waveguide structure, and they share an N-side electrode. Current may be adjusted separately for the two semiconductor lasers with strip waveguide structures to realize separate operations of the two lasers. Due to the two lasers are prepared on the same epitaxial wafer and are quite close in distance, a set of optical paths may be shared in subsequent fiber coupling and optical shaping. By controlling the two lasers to be operated separately, two single-mode laser lased by the same laser may be realized. Such the on-chip integrated structure reduces volumes of an external pump source and a cooling device, and reduces costs of production and preparation.

Although the present disclosure has been shown and described with reference to specific exemplary embodiments of the present disclosure, those skilled in the art should understand that, various changes in forms and details may be made without departing from the spirit and scope of the present disclosure defined by the appended claims and their equivalents. Therefore, the scope of the present disclosure should not be limited to above-mentioned embodiments, but should be determined not only by the appended claims, but also by the equivalents of the appended claims.

We claim:
1. An on-chip integrated semiconductor laser structure, comprising:
a substrate;
an epitaxial structure comprising a first N contact layer, a first N confinement layer, a first active region, a first P confinement layer, a first P contact layer, an isolation layer, a second N contact layer, a second N confinement layer, a second active region, a second P confinement layer, and a second P contact layer sequentially deposited on the substrate;
a first waveguide being etched from the second P contact layer to an interface of the second active region, and a second waveguide being etched from the first P contact layer to an interface of the first active region;
a first optical grating on both sides of the first waveguide, and a second optical grating on both sides of the second waveguide to realize selection of laser modes; and
a first N-side current injection window being prepared on the second N contact layer, a second N-side current injection window being prepared on the first N contact layer, and a first P-side current injection window being prepared on the first waveguide, and a second P-side current injection window being prepared on the second waveguide.

2. The on-chip integrated semiconductor laser structure according to claim 1, further comprising a first current isolation zone and a second current isolation zone, wherein:
the first current isolation zone is between the first P-side current injection window and the second P-side current injection window to form an electrical isolation; and
the second current isolation zone is between the first P-side current injection window and the first N-side current injection window to form an electrical isolation.

3. The on-chip integrated semiconductor laser structure according to claim 1, further comprising a first current injection slot, a second current injection slot, and a third current injection slot, wherein:
the first current injection slot is etched to the first P contact layer;
the second current injection slot is etched to the second N contact layer;
the third current injection slot is etched to the first N contact layer; and
the third current injection slot is located in the second current injection slot, and the second waveguide is in the first current injection slot.

4. The on-chip integrated semiconductor laser structure according to claim 1, wherein:
the substrate is an N-type GaSb substrate;
the first N contact layer is N-type doped, a material composition of the first N contact layer is GaSb, a doping concentration of the first N contact layer is $1\times10^{17}$-$1\times10^{19}$ cm$^{-3}$, and a thickness of the first N contact layer is 200 nm-700 nm;
a material of the first N confinement layer is AlGaAaSb, an Al composition of the first N confinement layer is 0.4-0.9, a doping concentration of the first N confinement layer is $1\times10^{18}$-$8\times10^{18}$ cm$^{-3}$, and a thickness of the first N confinement layer is 600 nm-3000 nm;
the first active region is unintentionally doped, a material of the first active region is AlGaAsSb\InGaAsSb\AlGaAsSb, an Al composition of the first active region is 0.1-0.3, an In composition of the first active region is 0.25-0.4, and a thickness of the first active region is 100 nm-700 nm;
the first P confinement layer is P-type doped, a material of the first P confinement layer is AlGaAaSb, an Al composition of the first P confinement layer is 0.4-0.9, a doping concentration of the first P confinement layer is $1\times10^{18}$-$1\times10^{18}$ cm$^{-3}$, and a thickness of the first P confinement layer is 600 nm-3000 nm;
the first P contact layer is P-type doped, a material of the first P contact layer is GaSb, a doping concentration of the first P contact layer is $1\times10^{17}$-$1\times10^{19}$ cm$^{-3}$, and a thickness of the first P contact layer is 50 nm-300 nm;
the isolation layer is unintentionally doped, a material of the isolation layer is $Al_{0.1}Ga_{0.9}Sb\backslash Al_{0.6}Ga_{0.4}AsSb\backslash Al_{0.1}Ga_{0.9}AsSb$, an Al composition of the isolation layer linearly changes from $Al_{0.1}Ga_{0.9}Sb$ to $Al_{0.6}Ga_{0.4}AsSb$ and then linearly changes to $Al_{0.1}Ga_{0.9}AsSb$, and a thickness of a gradation zone is 300 nm-900 nm;
the second N contact layer is N-type doped, a material of the second N contact layer is GaSb, a doping concentration of the second N contact layer is $1\times10^{17}$-$1\times10^{19}$ cm$^{-3}$, and a thickness of the second N contact layer is 300 nm-900 nm;
a material of the second N confinement layer is AlGaAsSb, an Al composition of the second N confinement layer is 0.5-0.85, a doping concentration of the second N confinement layer is $1\times10^{18}$-$8\times10^{18}$ cm$^{-3}$, and a thickness of the second N confinement layer is 600 nm-3000 nm;
the second active region is unintentionally doped, a material of the second active region is AlGaAsSb\InGaAsSb\AlGaAsSb, an Al composition of the second active region is 0.15-0.35, an In composition of the second active region is 0.1-0.3, and a thickness of the second active region is 100 nm-600 nm;
the second P confinement layer is P-type doped, a material of the second P confinement layer is AlGaAsSb, an Al composition of the second P confinement layer is 0.5-0.85, a doping concentration of the second P confinement layer is $1\times10^{18}$-$8\times10^{18}$ cm$^{-3}$, and a thickness of the second P confinement layer is 600 nm-3000 nm; and
the second P contact layer is P-type heavily doped, a material of the second P contact layer is GaSb, a doping concentration of the second P contact layer is $1\times10^{17}$-$1\times10^{19}$ cm$^{-3}$, and a thickness of the second P contact layer is 50 nm-500 nm.

5. The on-chip integrated semiconductor laser structure according to claim 1, wherein the first waveguide and the second waveguide are strip waveguides with a width of 1 μm-6 μm.

6. The on-chip integrated semiconductor laser structure according to claim 1, wherein the first optical grating and the second optical grating are periodic optical gratings, and an optical grating period satisfies $\lambda = \Lambda \times Neff/m$, where $\lambda$ is a laser lasing wavelength, Neff is an effective refractive index of a waveguide, $\Lambda$ is an optical grating period, and m is an optical grating order.

7. The on-chip integrated semiconductor laser structure according to claim 1, wherein the first N-side current injection window and the second N-side current injection window are configured to implement an electrical conduction between the second N contact layer and the substrate.

8. The on-chip integrated semiconductor laser structure according to claim 2, wherein widths of the first current isolation zone and the second current isolation zone are 30 µm-300 µm.

9. A method for preparing an on-chip integrated semiconductor laser, comprising:
preparing a substrate;
depositing an epitaxial structure on the substrate;
forming waveguides and current injection slots on the epitaxial structure by photolithography and etching;
preparing optical grating mask patterns on both sides of the waveguides;
depositing an insulating dielectric layer in the current injection slots, and photoetching the insulating dielectric layer to form a current injection window;
forming electrode patterns by photolithography, depositing P-side metal electrodes, and preparing a first current isolation zone and a second current isolation zone by stripping or etching;
thinning and polishing the substrate, and forming a back electrode on the back of the substrate; and
performing an anneal and a cleavage to form rectangular chips to complete the preparation.

10. The method for preparing an on-chip integrated semiconductor laser according to claim 9, wherein the forming waveguides and current injection slots on the epitaxial structure by photolithography and etching comprises:
forming a first waveguide by photolithography and etching;
forming a first current injection slot by photolithography and etching;
forming a second waveguide in the first current injection slot by photolithography and etching;
forming a second current injection slot by photolithography and etching; and
forming a third current injection slot in the second current injection slot by photolithography and etching.

11. The on-chip integrated semiconductor laser structure according to claim 5, wherein the first waveguide and the second waveguide are etched to prepare waveguides of the same height.

12. The on-chip integrated semiconductor laser structure according to claim 5, wherein the first waveguide and the second waveguide are etched to prepare waveguides of different heights.

13. The on-chip integrated semiconductor laser structure according to claim 6, wherein the first optical grating is perpendicular to an extending direction of the first waveguide, and the second optical grating is perpendicular to an extending direction of the second waveguide.

* * * * *